(12) United States Patent
Hu et al.

(10) Patent No.: US 9,288,907 B2
(45) Date of Patent: Mar. 15, 2016

(54) MICROELECTRONIC 3D PACKAGING STRUCTURE AND METHOD OF MANUFACTURING THE SAME

(71) Applicant: CHUNG-SHAN INSTITUTE OF SCIENCE AND TECHNOLOGY ARMAMENTS BUREAU, M.N.D., Longtan Township (TW)

(72) Inventors: Shao-Chung Hu, Longtan Township (TW); Kuo-Yang Horng, Longtan Township (TW); Ling-Yueh Yang, Longtan Township (TW); Wei-Ching Liu, Longtan Township (TW); Pen-Shan Chao, Longtan Township (TW); Kun-Feng Chen, Longtan Township (TW); Louis Lu-Chen Hsu, Longtan Township (TW)

(73) Assignee: NATIONAL CHUNG SHAN INSTITUTE OF SCIENCE AND TECHNOLOGY (TW)

( * ) Notice: Subject to any disclaimer, the term of this patent is extended or adjusted under 35 U.S.C. 154(b) by 0 days.

(21) Appl. No.: 14/217,621

(22) Filed: Mar. 18, 2014

(65) Prior Publication Data
US 2015/0271921 A1    Sep. 24, 2015

(51) Int. Cl.
| | |
|---|---|
| *H01L 23/12* | (2006.01) |
| *H05K 1/14* | (2006.01) |
| *H05K 1/18* | (2006.01) |
| *H05K 1/11* | (2006.01) |
| *H05K 1/02* | (2006.01) |
| *H05K 3/32* | (2006.01) |
| *H05K 3/36* | (2006.01) |

(52) U.S. Cl.
CPC ................ *H05K 1/14* (2013.01); *H05K 1/0216* (2013.01); *H05K 1/11* (2013.01); *H05K 1/181* (2013.01); *H05K 3/32* (2013.01); *H05K 3/366* (2013.01); *H05K 2201/04* (2013.01); *Y10T 29/49126* (2015.01)

(58) Field of Classification Search
CPC .............. H01L 23/4822; H01L 25/065; H01L 25/0657; H01L 25/18; H01L 2225/06513; H01L 2225/06527; H01L 2225/06551
See application file for complete search history.

(56) References Cited

U.S. PATENT DOCUMENTS

| | | | | | |
|---|---|---|---|---|---|
| 5,990,472 | A | * | 11/1999 | Rinne | 250/214.1 |
| 7,608,919 | B1 | * | 10/2009 | Bernstein et al. | 257/685 |
| 2003/0042599 | A1 | * | 3/2003 | Farrar | 257/723 |
| 2005/0237722 | A1 | * | 10/2005 | Hable | 361/728 |
| 2013/0335909 | A1 | * | 12/2013 | Koo | 361/679.31 |

* cited by examiner

*Primary Examiner* — Shaun Campbell
(74) *Attorney, Agent, or Firm* — Schmeiser, Olsen & Watts, LLP (57) ABSTRACT

A microelectronic 3D packaging structure and a method of manufacturing the same are introduced. The microelectronic 3D packaging structure includes a first board with a plurality of a first edges and disposed with a first electronic device; a second board with a plurality of a second edges and disposed with a second electronic device, wherein at least one second edge of the second board is jointed to at least one first edge of the first board to form a joint line; and a joint connection portion disposed at the joint line of the two adjacent boards and adapted to function as a connection path for transmitting signals.

14 Claims, 13 Drawing Sheets

MICROELECTRONIC 3D PACKAGING STRUCTURE AND METHOD OF MANUFACTURING THE SAME

FIELD OF TECHNOLOGY

The disclosed embodiments generally relate to electronic packaging technologies and, more particularly, to microelectronic 3D packaging technologies.

BACKGROUND

Conventional electronic products are equipped with various electronic devices characterized by versatility and intricate electronic circuits and devices. Due to the ever-increasing demand for computation power, data processing speed, and storage capacity of electronic products, it is desirable to integrate as many semiconductor devices as possible on a chip. In addition, it is also desirable to pack as many chips as possible in Today's electronic products.

A 3D-stack chip package has been disclosed; mostly a plurality of memory chips of same or different kinds, such as DRAM, SRAM, and Flash chips have been stacked for such applications. Through-silicon-vias (or TSB's) have been used to form interconnects for these stacked chips. Furthermore, processors, logics and more memory chips have also been stacked in the 3D packaging structure in a similar manner. However, such 3D-stack packaging has some fatal disadvantages, mainly whenever any one of the stacking-chip fails, the whole package must be discarded. There is almost no reparability for this kind of 3D-stack chip package.

Another 3D packaging technology disclosed utilizes a folding-up technique. After folding a foldable material, a cubic or a pyramid shaped structure is formed which comprises a plurality of circuit surfaces. In between any two adjacent circuit surfaces exists a folding portion. The electrical interconnect among these different circuit surfaces are achieved by providing wires across the folding portions. Nonetheless, such wirings across the folding portions are done prior to the folding process. This folding-up technique package can only be used for low speed operations because there is no interconnects can be formed between adjacent circuit surfaces without a folding portion. In order for them to be interconnected, the wire must be routed with extra distance.

One more 3D packaging structure has been disclosed by folding and stacking a plurality of flexible circuit boards on a substrate. Such fold-and-stack 3D packaging technology suffers similar problems as those of the conventional 3D stack chips, for example, poor thermal dissipation, incapable of subsequent inspection, lack of reparability. Moreover, the signal integrity is also a concern due to significant interference between the electronic devices which are closely mounted on top of each other.

In view of this, there is a sufficient room for improvement in terms of 3D packaging structure design, for example, how to overcome overly long circuit wire paths, how to minimize signal interference, improve thermal dissipation, repair a defective chip, etc. Microelectronic 3D packaging structures and methods disclosed here are directed to addressing one or more of the problems set forth above.

SUMMARY

One embodiment of the present disclosure is to provide a microelectronic 3D packaging structure, which includes a first board having a first electronic device and a second board having a second electronic device. At least one edge of the second board is jointed to at least one edge of the first board via a joint connection portion. The joint connection portion provides functions not only for physical bonding of the two adjacent boards but also for electrical interconnection for signal transmittal between these two boards.

The other embodiment of the present disclosure provides a microelectronic 3D packaging structure, which including: a folding board set having a plurality of board surfaces and a plurality of folding connection portions each connecting two adjacent board surfaces, wherein a folding line is disposed on each of the folding connection portions and adapted to enable the boards to form a folded structure; and at least a joint connection portion disposed at a joint line of two adjacent board surfaces in the folded structure and adapted to function as a connection path for transmitting signals between two adjacent board surfaces.

The present disclosure further provides a method of manufacturing the aforesaid microelectronic 3D packaging structure, comprising the steps of: (1) providing the folding board set, wherein each one of the plurality of board surfaces has at least a predetermined folding line, with a first zone being located on one side of the folding line and a second zone being located on the opposite side of the folding line; (2) mounting at least an electronic device on the first and second zones, respectively; (3) interconnecting the electronic devices across the folding line; (4) folding the folding substrate set along the folding line to form the folded structure and resulting in at least a joint line on a sidewall of the folded structure; and (5) interconnecting the electronic devices across the joint line(s) on the sidewall by a joint connection portion.

BRIEF DESCRIPTION

Objectives, features, and advantages of the present disclosure are hereunder illustrated with specific embodiments in conjunction with the accompanying drawings.

DETAILED DESCRIPTION

The present disclosure provides a microelectronic 3D packaging structure characterized by a joint structure and electrical connection between two adjacent boards which adjoin each other at a joint line. A joint connection portion capable of electrical connection is disposed at the joint line, such that microelectronic 3D structure has an additional electrical connection path on adjacent adjoining boards (i.e., non-folded boards), so as to provide a short direct electrical connection path between the electronic devices mounted on the microelectronic 3D structure.

The joint structure is characterized in that two adjacent boards at a joint line are jointed together by means of a latch, a socket, a slot, an anchor, a pin, a rail, an adhesive, and combination thereof. Electrical connection between the two adjacent boards at the joint line is achieved by means of a bonding wire, a solder bump, a sol gel print wire, an electrically conductive latch device, an electrically conductive socket device, an electrically conductive anchor device, an electrically conductive mechanical switch, an optical fiber, and combination thereof, for example. The joint structure and the electrical connection can be achieved in the form of structural joint and electrical connection by means of an integrated structure. For instance, the socket is built-in with a metal contact for use as the electrically conductive socket device, whereas the latch is built-in with a metal pin for use as the electrically conductive latch device. However, persons skilled in the art understands that the integration of the joint structure and electrical connection is illustrative rather than restrictive of the present disclosure, and thus any electrical connection and joint structure formed between two adjacent boards at a joint line in a microelectronic 3D structure must fall within the scope of the present disclosure. The present disclosure is hereunder illustrated with exemplary embodiments.

Figure 1:
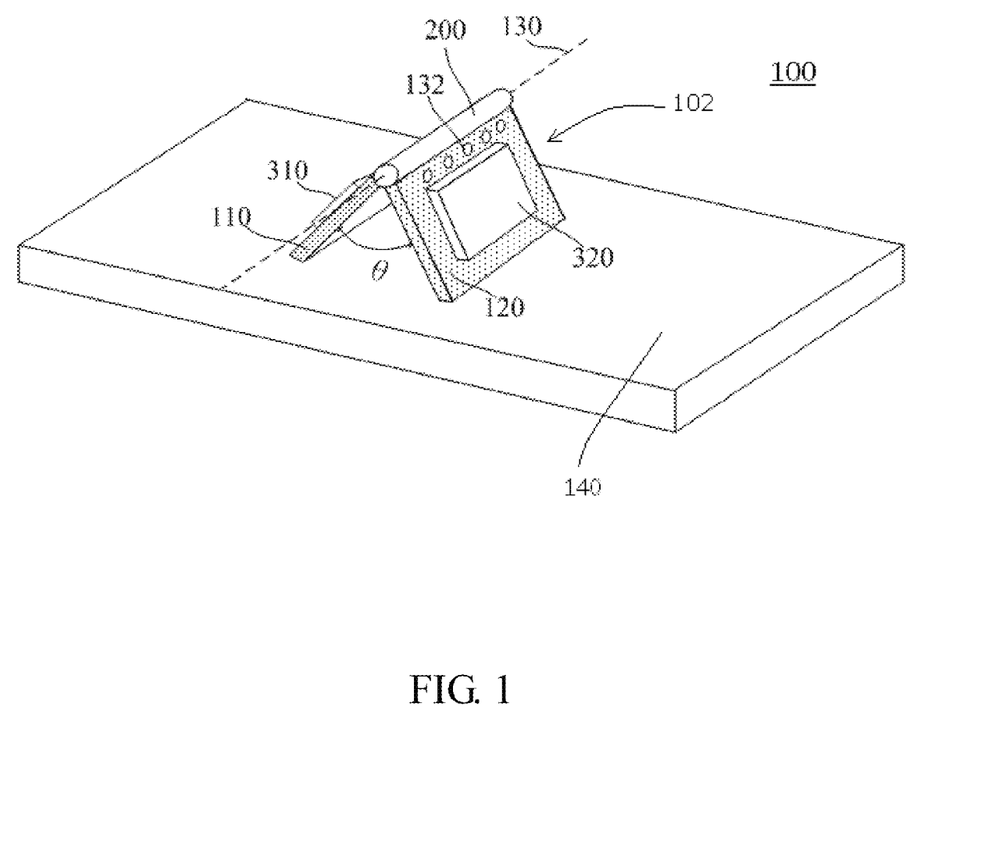
FIG. 1 is a perspective view of a microelectronic 3D packaging structure according to the first embodiment of the present disclosure.

Referring to FIG. 1, there is shown a perspective view of a microelectronic 3D packaging 100 which includes a sub-structure 102 stand-alone, or be mounted on a substrate 140, according to the first embodiment of the present disclosure. The microelectronic 3D packaging structure of the present disclosure comprises a first board 110, a second board 120, and a joint connection portion 200 which joints the first board 110 and the second board 120 together. The first board 110 has thereon a first electronic device 310. The second board 120 has thereon a second electronic device 320. The material of the first board 110 and second board 120 may be selected from the group consisting of polymer, glass, ceramic, semiconductor, metal, metal oxide, and a combination thereof. For example, the polymer may include, but not limited to, PTFE, hydrocarbons, LCP, PPO/PPE. The polymer may further contain different kinds of reinforcements, such as glass fibers or ceramic fillers. The boards may also be embedded with multi-layer interconnects.

A plurality of edges of the first board 110 is defined as a plurality of first edges. A plurality of edges of the second board 120 is defined as a plurality of second edges. In FIG. 1, the first board 110 and the second board 120 each have four edges. A joint line 130 demarcates the joint location of the first board 110 and the second board 120. In other words, the first board 110 and the second board 120 together connect with the joint connection portion 200. These two boards are edge-to-edge joined to each other with an angle θ which is ranged from about 5° to about 175°. Moreover, the joint connection portion 200 provides an electrical connection path whereby the signal transmission between the first board 110 and the second board 120 takes place. In addition, a third board (not shown) having at least one third electronic device and a plurality of third edges may also be added, and at least one third edge of the third board is jointed to at least one of the first edges and/or the second edges via extra joint connection portions.

The first electronic device 310 and the second electronic device 320 each can be an IC chip, a discrete device, such as a resistor, a capacitor, and an inductor, or any active or passive device. These devices are mounted on the corresponding boards, wherein each board 110,120 may also comprises at least one set of on-board contacts 132. The devices 310,320 are linked to the contacts via the multi-layer interconnect embedded in the board. The contacts 132 are provided, for example, in the form of pads, balls, bumps, and other shapes. The joint connection portion 200 can be a "V-shaped" two-slot socket, the first board 110 can be inserted into the first slot, and the second board can be inserted into the second slot. Detailed structure of the socket and board connections is illustrated in FIG. 2c. The socket provides not only electrical connection 210 between two boards, but also physical structure to hold these two boards together. After they are assembled to form a sub-structure 102, the sub-structure can be mounted to a substrate 140.

Figure 2A:
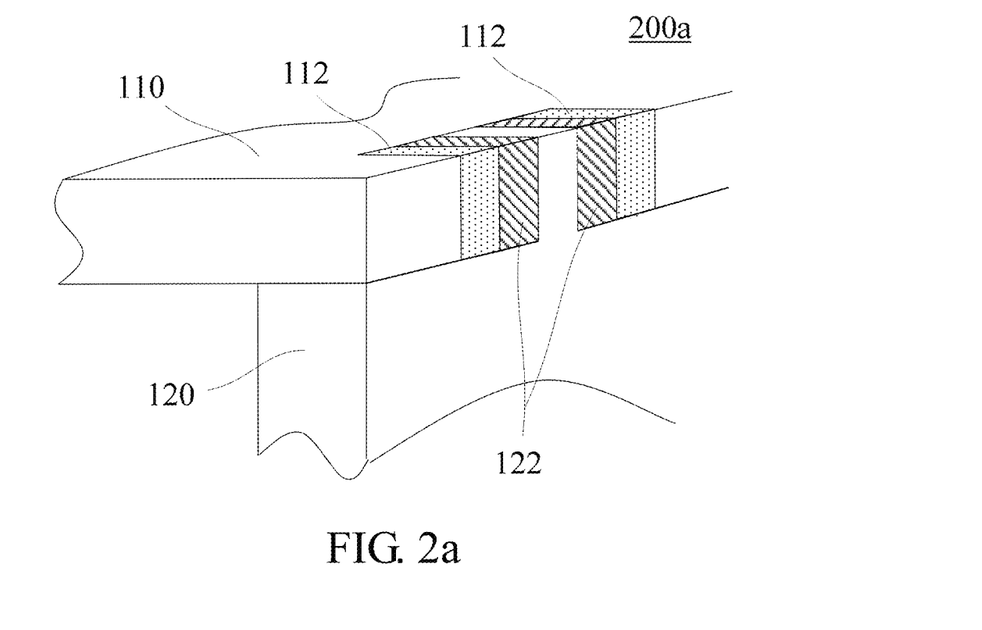
FIGS. 2a-2d are perspective views of a joint connection portion between adjacent boards according to an embodiment of the present disclosure.

Referring to FIG. 2a, there is shown a perspective view of a joint connection portion 200a between two adjacent boards according to an embodiment of the present disclosure. As shown in FIG. 2a, this embodiment is exemplified by a latch design. The joint connection portion 200a comprises an electrical connection portion for defining the connection path and a structural joint portion for jointing the first board 110 and the second board 120 together. One of the first edges and one of the second edges each have a plurality of latch-shape edges for latching the first edge and the second edge together and thus serving as the structural joint portion. At least one of the latch-shape edges is made of an electrically conductive material so as to serve as the electrical connection portion. Referring to FIG. 2a, a female latch 112 formed at the first edge of the first board 110 and a male latch 122 formed at the second edge of the second board 120 are closely latched together, such that the first board 110 is jointed to the second board 120. Moreover, since at least one of the male latch 122 and the female latch 112 pair is made of an electrically conductive material, or metal, such that an electrical connection path between the first board 110 and the second board 120 is established.

Figure 2B:
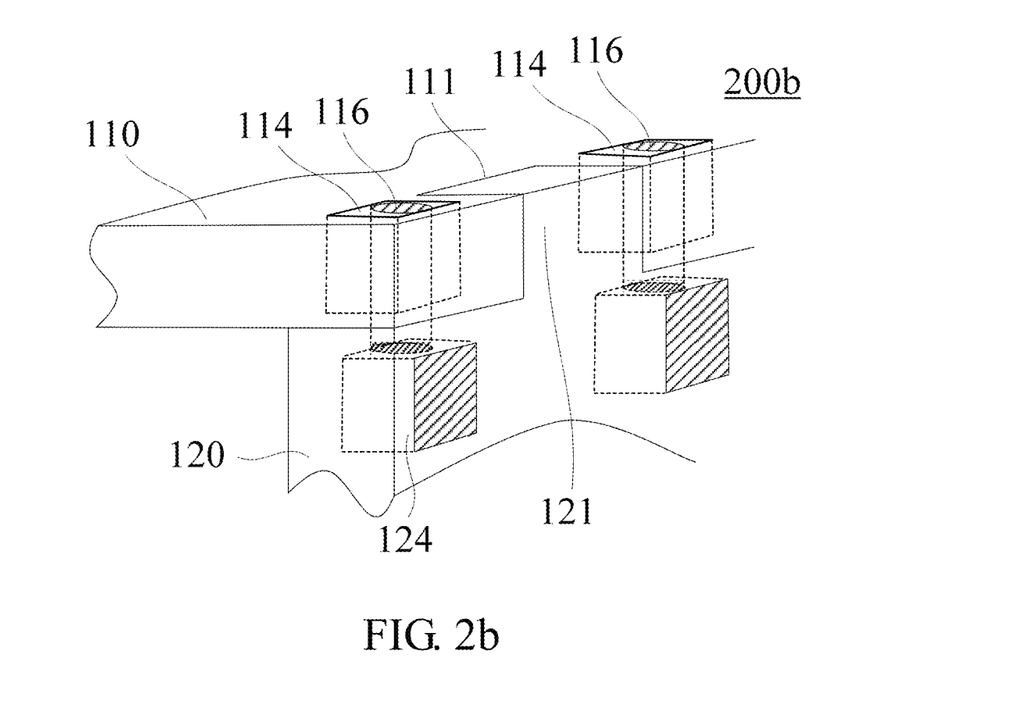
Figure 2C:
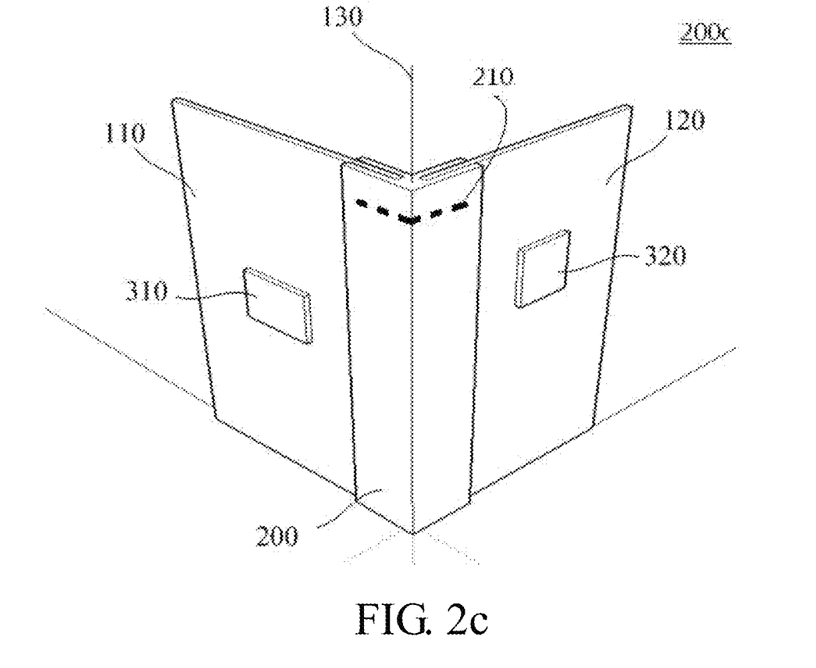

Referring to FIG. 2b, there is shown a perspective view of a joint connection portion 200b between adjacent boards according to an embodiment of the present disclosure. As shown in FIG. 2b, this embodiment is exemplified by another latch design. One edge of the first board 110 and one edge of the second board 120 each have a plurality of latch-shape edges for latching; for example, a protruding portion 121 of the second board 120 as shown in FIG. 2b and a denting portion 111 deployed on the first board 110 together form a structural joint portion. Moreover, at least one electrical connection portion is disposed in the vicinity of the structural joint portion. For example, the electrical connection portion of metal blocks 114, 124 are disposed on the first board 110 and the second board 120, respectively. At least one pins 116 penetrating the first board 110 and the second board 120 is provided. The pin 116 forms electrical connection between the metal blocks 114 and 124.

Figure 2D:
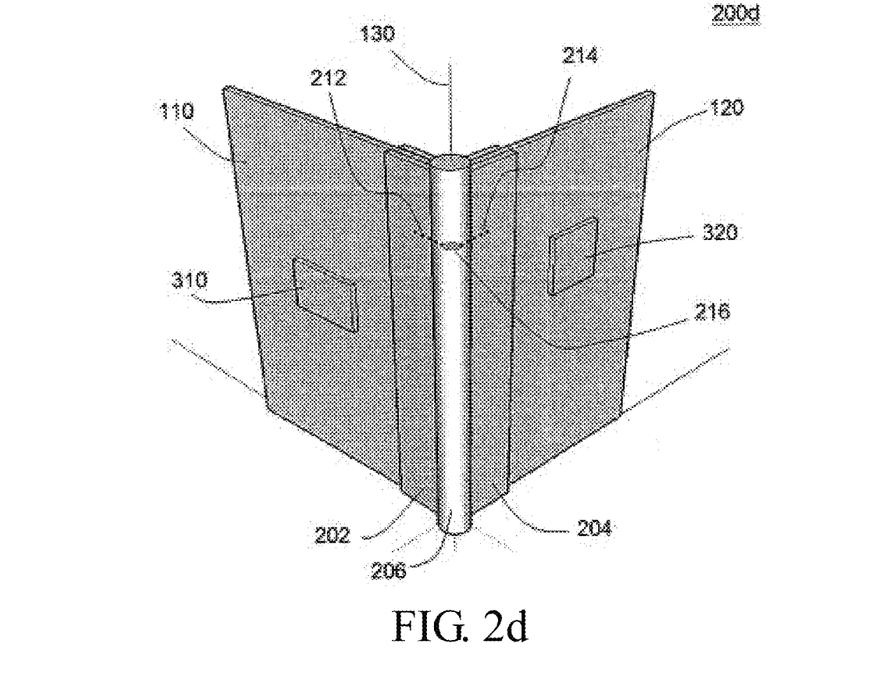

Referring to FIG. 2c, there is shown a perspective view of a joint connection portion 200c between adjacent boards according to an embodiment of the present disclosure. As shown in FIG. 2c, this embodiment is exemplified by a special socket 200 which comprises at least two slots, one slot for inserting a first board 110, another for inserting a second board 120. Internal connection 210 is provided to form conductive path between these two boards. Therefore, the joint connection portion 200c provides both structural support and electrical interconnects for two boards inserted. The socket used to hold and connect two adjacent boards edge-by-edge is called sidewall socket module. As shown FIG. 2c, the joint connection portion 200c is provided in the form of sidewall socket whereby the first board 110 and the second board 120 are connected with an angle from about 5° to about 175°; furthermore, the present disclosure is applicable to any socket whereby the first board 110 and the second board 120 are tilted relative to each other by any proper angle. As shown in FIG. 2d, in a preferred embodiment, a rotational axle along the joint line 130 can be provides to the sidewall socket module in the joint connection portion 206, such that after the first board 110 and the second board 120 are inserted into the first and second portion of sidewall socket module 202 and 204, respectively, the angle between them can be adjusted in a flexible way. At least one connection device 216 is provided inside the joint connection portion 206 to maintain wire 212 from the first board and 214 from the second board to be electrically connected.

Figure 3:
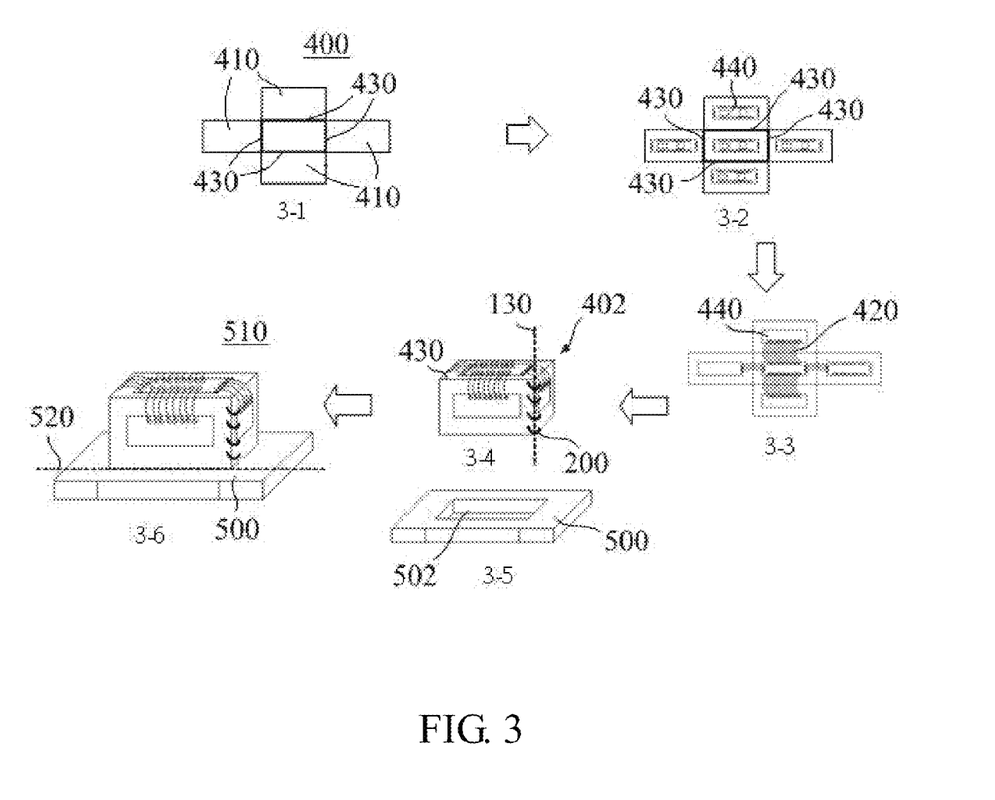
FIG. 3 is a schematic view of the process flow of an assembled microelectronic 3D packaging structure according to another embodiment of the present disclosure.

A perspective view of fabrication steps of a microelectronic 3D packaging structure according to one embodiment of the present disclosure is shown FIG. 3. The fabrication steps comprises:

Step 3-1, providing a folding board set 400. The folding board set 400 has a plurality of board surfaces 410 and a plurality of predetermined folding lines 430. Each folding lines is located in between two adjacent board surfaces and adapted to enable the folding board set to form a folded structure.

Step 3-2, mounting at least one device 440 on at least one board surfaces. In this particular example, each board surface is mounted with a device. There are many different kinds of known method to mount a chip on a board. For example, the chip can be wired bonded or flip-chip bonded to a board.

Step 3-3, forming interconnection between devices through a conventional back-end-of-the-line metal deposition and wiring patterning process. At this point, the chips are interconnected by the patterned wirings 420.

Figure 8:
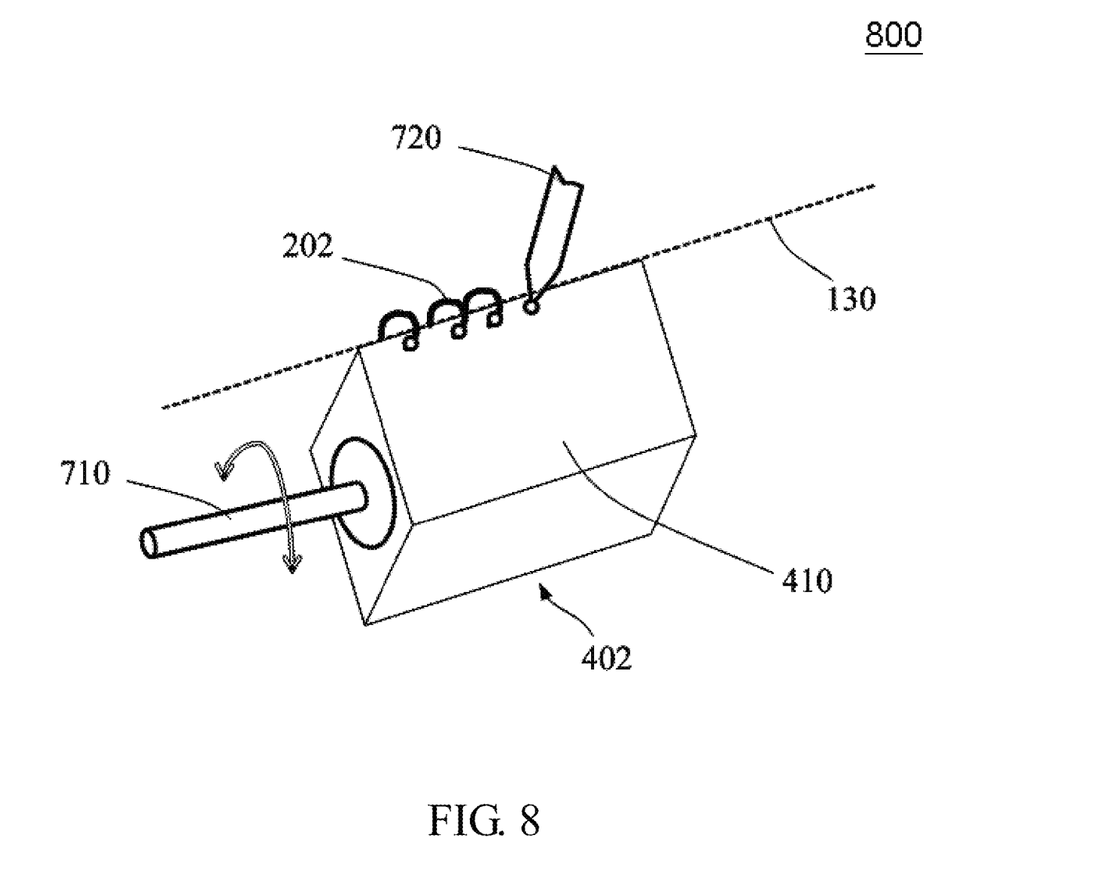
FIG. 8 is a schematic view of a method of manufacturing a electrical connection portion between adjacent boards.

Step 3-4, folding the board set to the folded structure 402 with or without a mold device (not shown). For example, a heat sink component with a proper size can be used as the mold for folding the board set. After folding process, the heat sink is wrapped inside the folded structure and stayed for the cooling purpose. A plurality of joint lines 130 are formed on the sidewall of the folded structure. Each board 410 may comprises a set of contacts (not shown) coupled to its corresponding devices. After folding, interconnects 200 between the adjacent board surfaces across the joint lines 130 can be formed by using a suitable method, including, but not limited to, wire-bonding, three-dimensionally wire printing, latching, pinning, installing socket, and anchoring. Furthermore, the adjacent boards may be physically jointed by means of any appropriate method, such as railing, slotting, pinning, anchoring, latching, socketing, gluing, and bonding. In this example, there are four (sidewall) joint lines 130, One example of forming wires across the joint line is illustrated in FIG. 8.

Step 3-5, providing a substrate 500 with (or without) a cavity 502. The size of the cavity is predetermined depending on the footprint of the folded structure 402. The cavity is prepared for installing a cooling device (not shown). Other examples of forming post-folding interconnections are shown in FIG. 4 and will be described later.

Figure 9A:
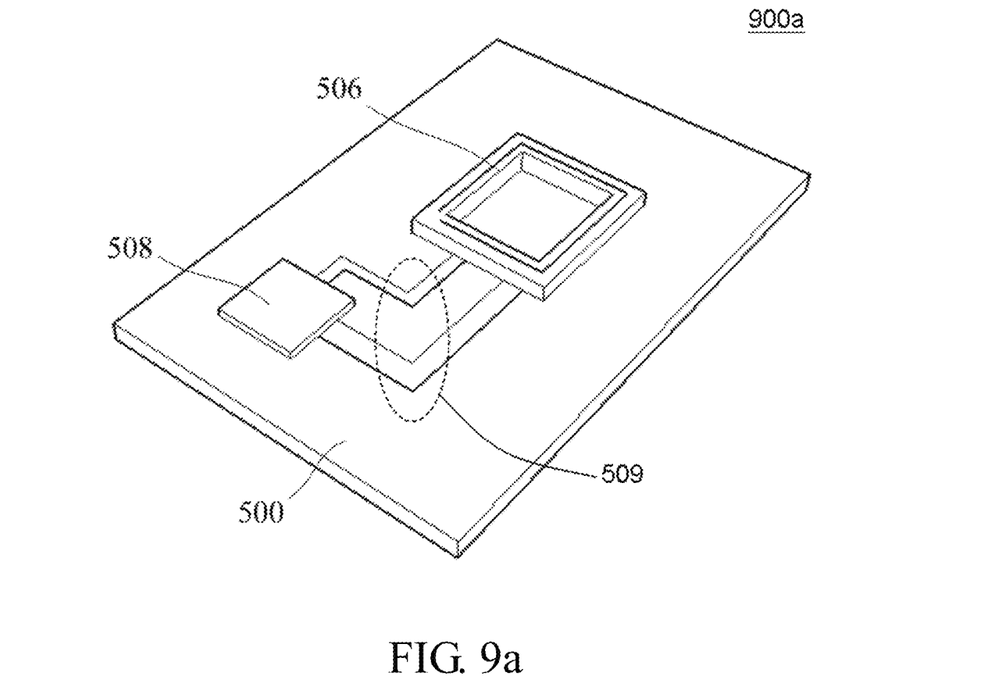
FIGS. 9a-9e are perspective views of a process flow of the method of manufacturing the microelectronic 3D packaging structure according to an embodiment of the present disclosure.
Figure 9B:
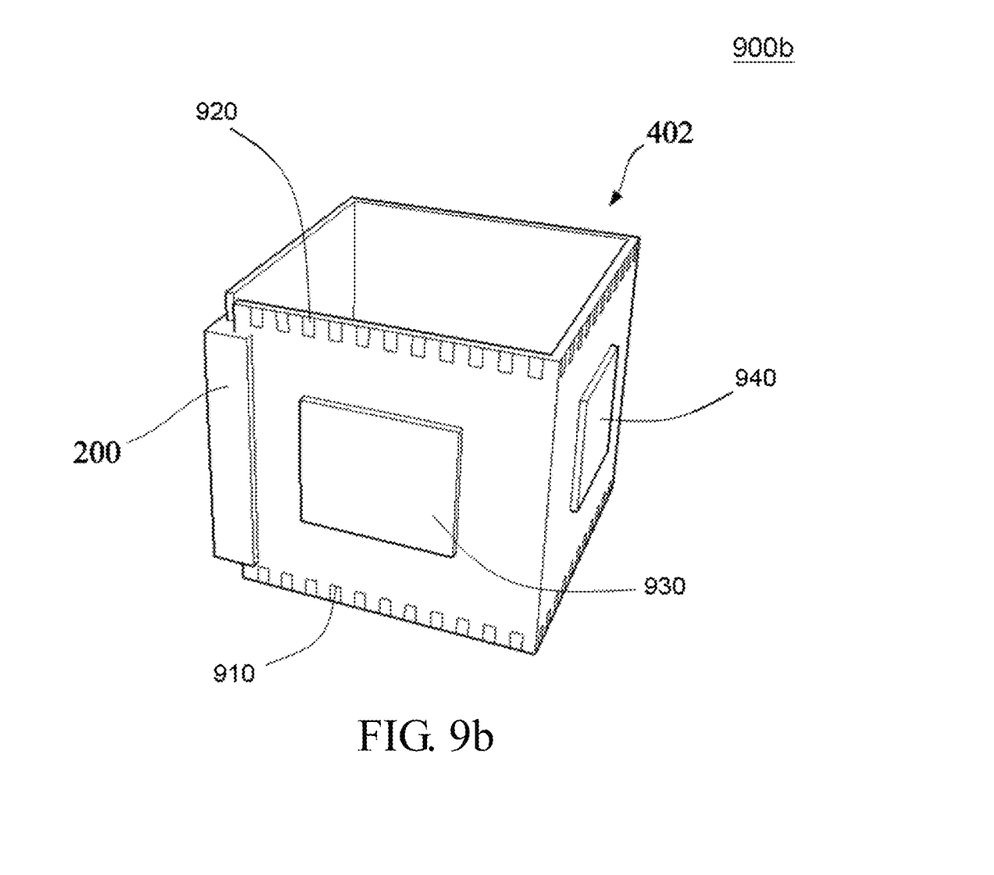

Step 3-6, mounting the folded structure 402 to the substrate 500, and resulting in a plurality of base joint lines 520. More devices can be located on the substrate 500 (not shown), therefore, devices on the boards are also interconnected to the devices on the substrate. An example to form such interconnect is illustrated in FIG. 9, and thus will not be further described here.

Figure 4:
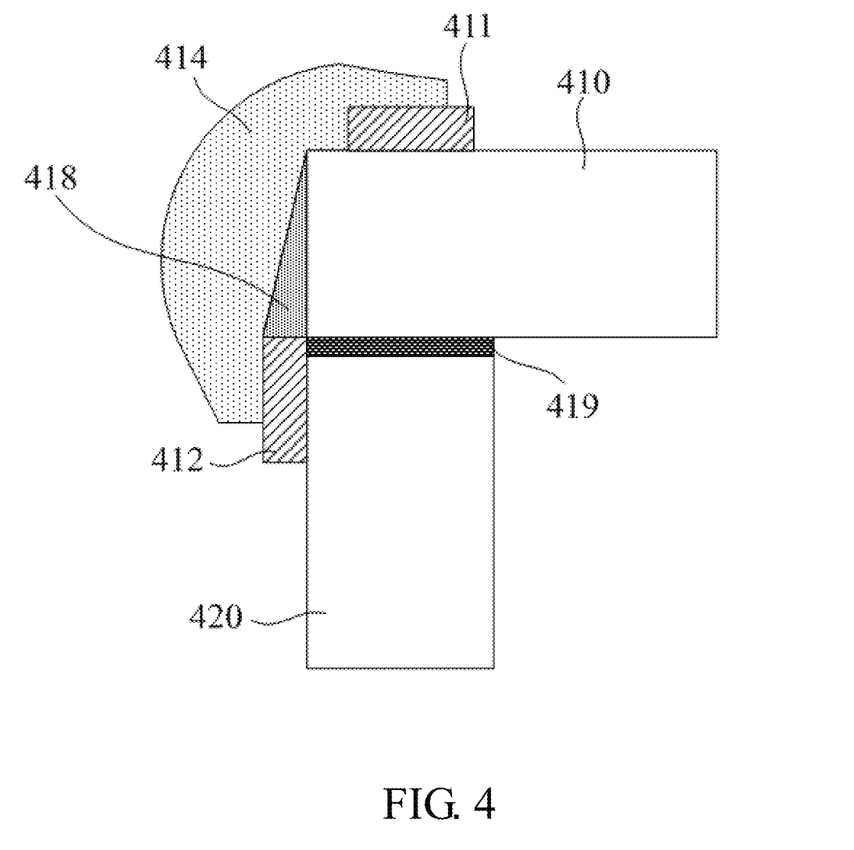
FIG. 4 is a schematic view of a electrical connection portion between adjacent boards according to an embodiment of the present disclosure.

As shown in FIG. 4, a schematic view of an electrical connection portion between adjacent boards across a joint line according to an embodiment of the present disclosure. A contact 411 is disposed on a first boards 410, and another contact 412 is disposed on a second board 420. These two adjacent contacts 411 and 412 are connected by a solder bump 414 which functions as the electrical connection portion. These two boards 410 and 420 are bounded by an adhesive 419 which functions as the structure connection portion. Preferably, an insulating spacer 418 is disposed between the two contacts 411 and 412. The insulating spacer 418 is mounted along the joint line for insulation purpose, wherein the insulating spacer 418 is made of a material selected from the group consisting of an adhesive, an epoxy, a plastic, a ceramic, a resin, and a combination thereof. The spacer is used to prevent metal to go into the same area and eventually cause short between adjacent contacts.

Figure 5:
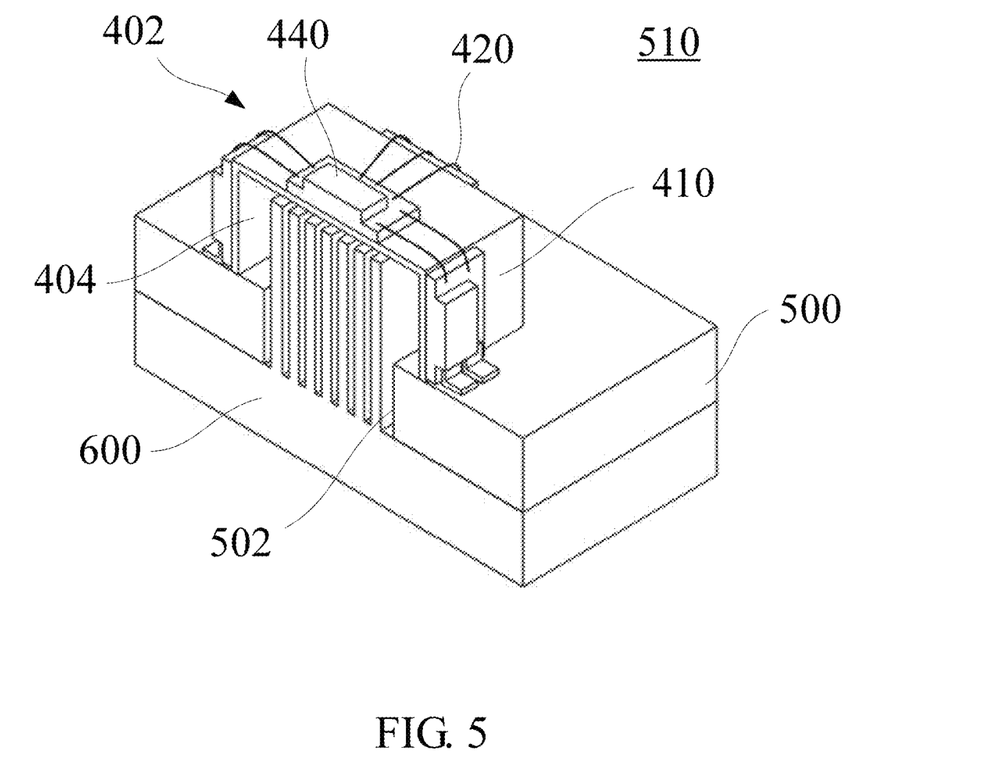
FIG. 5 is a perspective view of the assembled microelectronic 3D packaging structure according to another embodiment of the present disclosure.

FIG. 5 is a perspective view of the assembled microelectronic 3D packaging structure according to another embodiment of the present disclosure. In this embodiment, the base substrate 500 further comprises the cavity 502, and the folded structure 402 further defines therein the void space 404 which is aligned substantially with the cavity 502 and the void space 404 has therein a cooling device (e.g. Heat-sink) 600. Hence, the folded structure 402 defines therein the void space 404, the method of manufacturing the microelectronic 3D packaging structure further comprising the steps of: providing the cooling device 600 having a shape adapting to the void space of the folded structure 402; and installing the cooling device 600 into the void space 404, wherein the folded structure 402 is thermally coupled to the cooling device 600. Hence, the cooling device 600 further enhances heat dissipation performance and makes good use of space available to the base substrate by mounting thereon more boards than is disclosed in the prior art.

Figure 6:
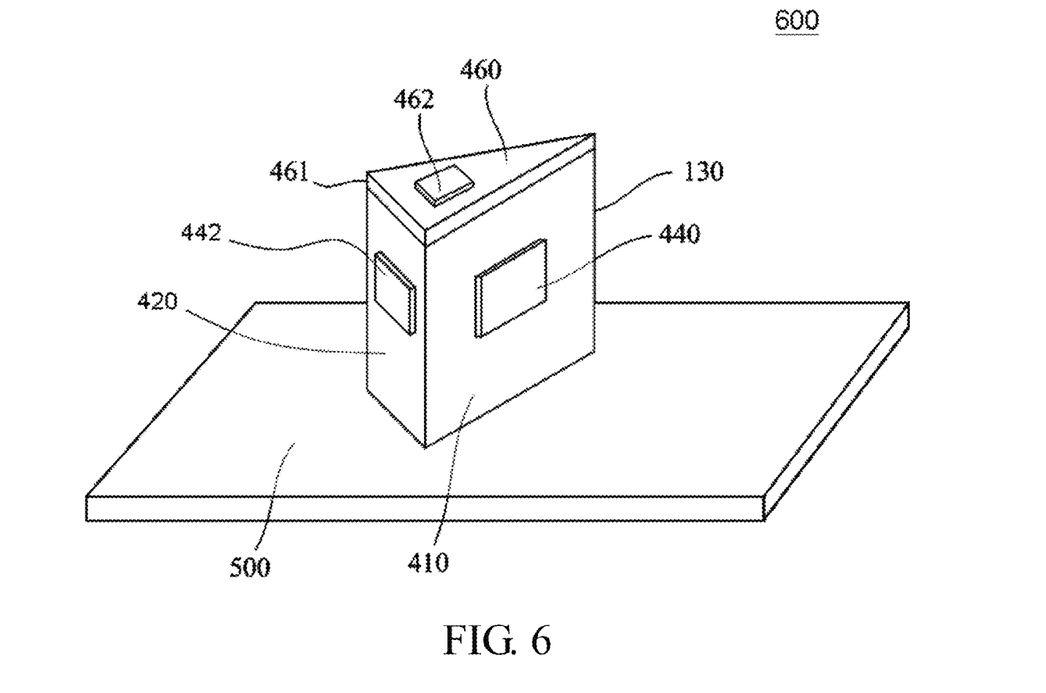
FIG. 6 is a perspective view of the assembled microelectronic 3D packaging structure according to one more embodiment of the present disclosure.

Referring to FIG. 6, a perspective view of the assembled microelectronic 3D packaging structure 600 according to an embodiment of the present disclosure is shown. The folding board set further comprises at least a lid board 460 jointed to edges of at least two of the boards through at least a lid joint portion 461 each selected from the group consisting of a rail, a slot, a pin, an anchor, a latch, an adhesive, a socket, and a combination thereof. And at least an electronic device 462 is disposed on the lid board 460 and coupled to the electronic device 440 on at least one hoard through a lid connection portion (not shown) which is selected from the group consisting of a bonding wire, a solder bump, a sol gel print wire, a soft board, an electrically conductive latch device, an electrically conductive socket device, an electrically conductive mechanical switch, an optical fiber, and a combination thereof.

Figure 7:
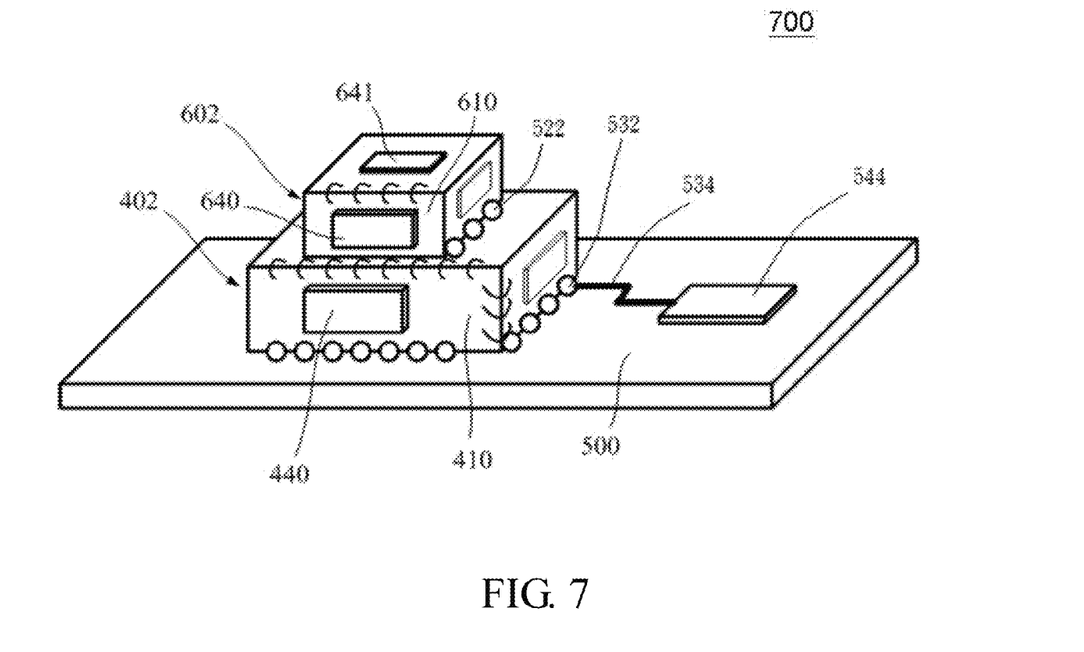
FIG. 7 is a perspective view of the assembled microelectronic 3D packaging structure according to another embodiment of the present disclosure.

As shown in FIG. 7, is a perspective view of the assembled microelectronic 3D packaging structure 700 according to another embodiment of the present disclosure. The 3D packaging structure 700 further comprises a second folded structure 602 which is stacked and mounted on top of a lower folded structure 402 via the joint connection portion described previously. The folded structure 402 is mounted on a substrate 500. An electronic device 640 on a sidewall of the second folded structure 602 is coupling to the electronic device 440 on a sidewall of the folded structure 402 via a connection means which is but not limited to select from the group consisting of a bonding wire, a solder bump, a sol gel print wire, a soft board, an electrically conductive latch device, an electrically conductive mechanical switch, an optical fiber, an electrically conductive anchor device, an electrically conductive socket device, and a combination thereof. The electronic device 641 on the top surface of the second folded structure 602 is coupling to the electronic device 440 on the folded structure 402 via a connection means which is but not limited to select from the group consisting of a bonding wire, a solder bump, a sol gel print wire, a soft board, an electrically conductive latch device, an electrically conductive mechanical switch, an optical fiber, an electrically conductive anchor device, an electrically conductive socket device, and a combination thereof. Any surface of the 3D packaging structure may be provided with a window (not shown) on the surface of one of the boards 410, 610. At least one chip 544 is mounted on the substrate 500, which is connected to the devices mounted on the fold structure 402 and/or 406 via interconnecting means including metal wires 534, first set of solder balls 532 and second set of solder balls 522. In this example, solder balls are used to form interconnects along the base joint lines. Other methods such as by means of wire-bonds, pins, latches, sockets, mechanical switch, etc. are not excluded from this proposal.

Referring to FIG. 8, there is shown a schematic view of a method of manufacturing an electrical connection portion between adjacent boards that edge-to-edge joined to each other. To interconnect the electronic devices across a joint line on the sidewall of the microelectronic 3D packaging structure, the method comprises the steps of: (1) mounting the folded structure 402 on a rotatable fixture 710; (2) aligning and landing a print nozzle 720 to a first contact on the folded structure 402, wherein the contacts are coupled to at least an electronic device on a corresponding one of the boards 410; (3) starting to inject a sol-gel conductive ink toward the first contact; (4) moving the nozzle 720 while rotating the fixture 710 to the next contact; and landing the nozzle 720 to the next contact and cut the wire; (5) repeating the process from step (2) to step (4), until all the contacts are linked with the sol-gel conductive ink.

For example, the material for sol-gel conductive ink mentioned above may include Silver, Titanium nano-particles which are dissolved in a solvent and be injected by the nozzle 720. The printed wires 202 are then sintered at a temperature from 150 to 300. The resulting resistivity is in the range from 10-3 to 10-5 ohm-cm.

Figure 9C:
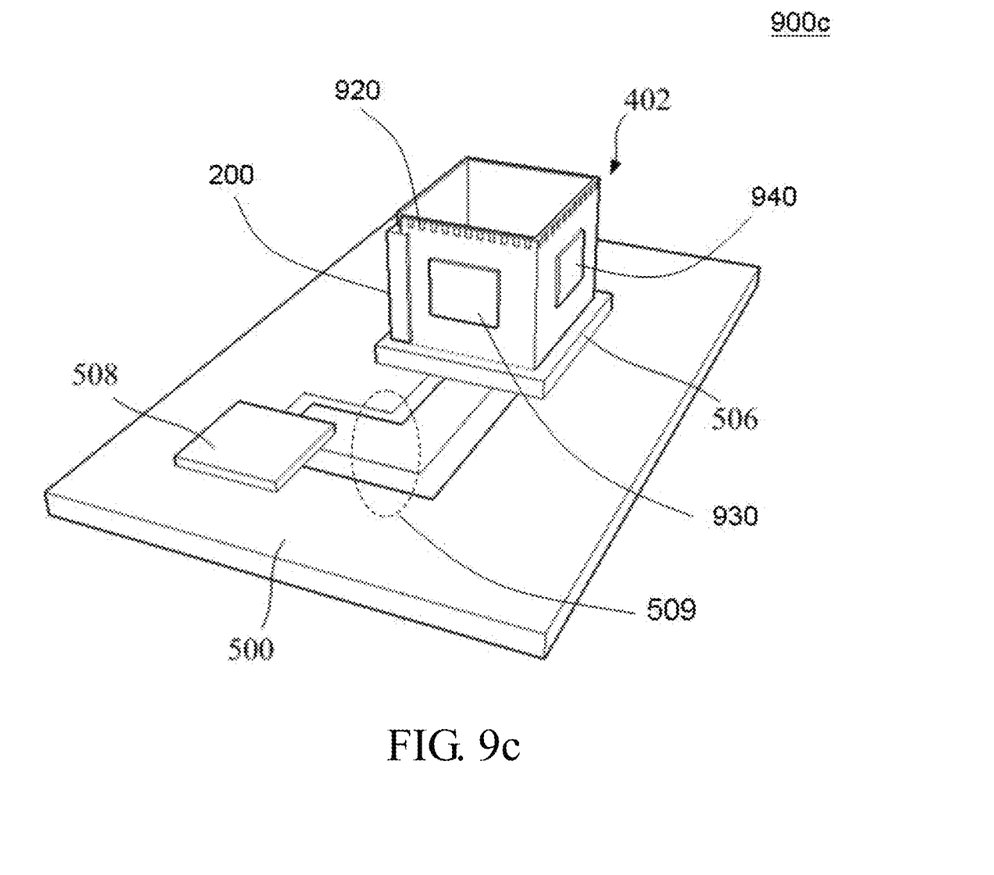
Figure 9D:
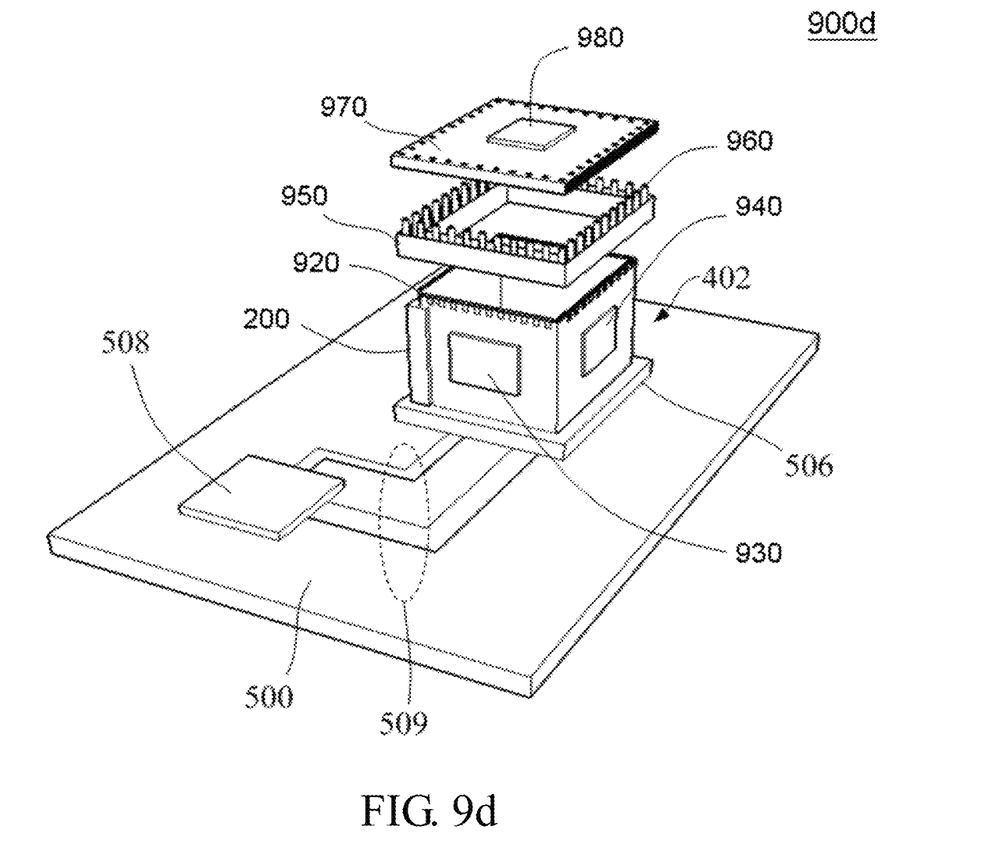
Figure 9E:
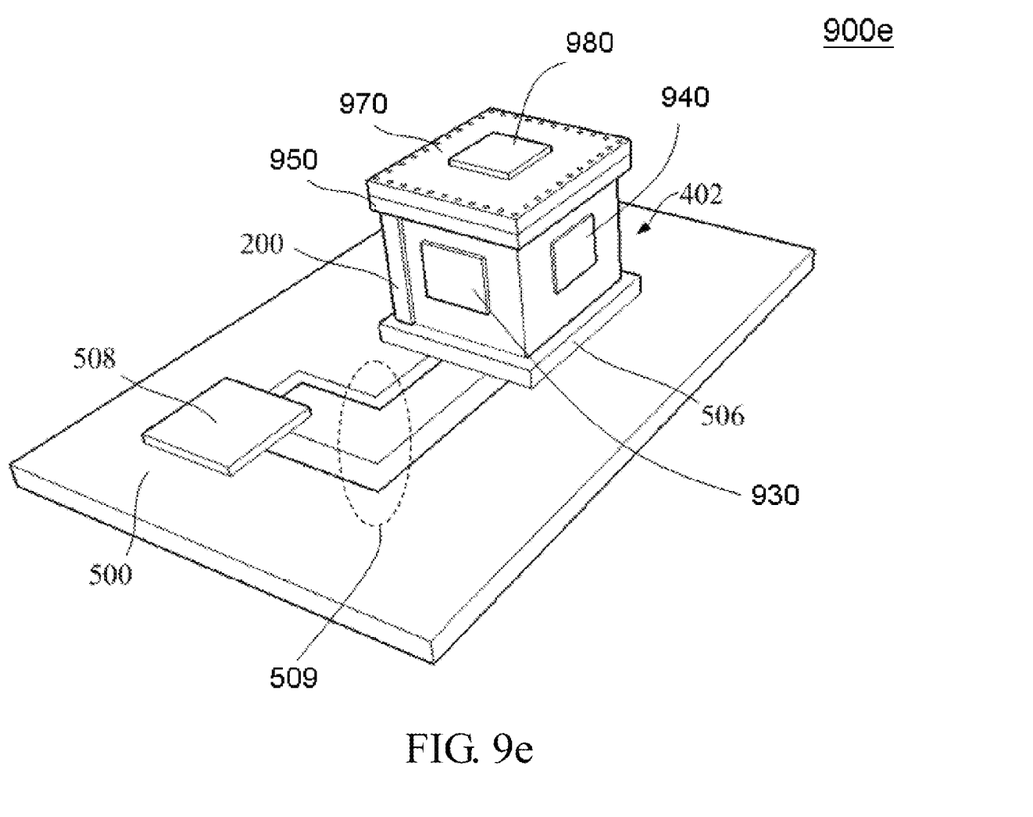

FIGS. 9a-9e, illustrate a sequential process flow of manufacturing a microelectronic 3D packaging structure according to a preferred embodiment of the present disclosure. The method comprises following steps: (1) providing a base substrate 500 having at least a chip 508, prefabricated substrate wires 509 and a plurality of socket mounting holes (not shown); (2) mounting at least one base socket module 506 on the socket mounting holes 900a (FIG. 9a); (3) preparing a 3D folded structure 402 (FIG. 9b) by using at least one sidewall socket module 200 to join at least two prefabricated boards 900b. It is desirable to use as many sidewall sockets as possible to join the boards for the purpose of easy reparability. In other words, when any board is found to be defective, the board can be replaced without difficulty. Each board has a row of upper connection means 920 and a row of lower connection means 910. After assembled, the folded structure 402 has an upper ring of connection means 920, and lower ring of connection ring 910; (4) inserting the folded structure 402 into the base socket module 506. The chips 930 and 940 on the folded structure are connected to the chip 508 on the substrate through the lower ring of connection means 910, base socket 506 and substrate wires 509 (FIG. 9c); (5) mounting a cap socket module 950 with a plurality of connection pins 960 on top of the folded structure 402; and (6) mounting a lid board 970 on top of the cap socket module 950 so as for the lid board 970 to be fixed to the folded structure 402. The chip 980 located on the lid board is electrically connected to the chips 930 and 940 located on the folded structure via pins 960 and upper ring of connection means 920.

In conclusion, a novel 3D package structure and method are proposed in this disclosure. It allows high-performance microelectronic devices to be packed in a more robust manner with advantage of better thermal dissipation, lower signal interference, and easier to repaired.

The present disclosure is disclosed above by preferred embodiments. Nonetheless, persons skilled in the art understand that the preferred embodiments are illustrative of the present disclosure only and are not to be interpreted as restrictive of the scope of the present disclosure. Equivalent modifications and replacements made to the aforesaid embodiments should fall within the scope of the present disclosure. Therefore, the legal protection for the present disclosure should be defined by the appended claims.

What is claimed is:

1. A microelectronic 3D packaging structure, comprising:
a first board with a plurality of first edges and disposed with at least one first electronic device;
a second board with a plurality of second edges and disposed with at least one second electronic device,
wherein at least one second edge of the second board is jointed to at least one first edge of the first board to form at least one joint line;
a third board with a plurality of third edges and disposed with at least one third electronic device, wherein one of the third edges of the third board is jointed to at least one of the first edges and the other one of the third edges of the third board is jointed to at least one of the second edges; and
a joint connection portion disposed at the joint line of two adjacent boards and provides at least one connection path for transmitting signals between the first board and the second board;
wherein the first board, the second board and the third board further define therein a void space aligned substantially with a cavity disposed on a substrate which the microelectronic 3D packaging structure is mounted on.

2. The microelectronic 3D packaging structure of claim 1, wherein the first board and the second board are edge-to-edge jointed with an angle between about 5° and about 175°.

3. The microelectronic 3D packaging structure of claim 1, wherein the joint connection portion comprises an electrical connection portion for defining the electrical connection path and a structural joint portion for jointing the first board and the second board together, one of the first edges and one of the second edges each have a plurality of predetermined latch-shape edges for latching the first edge and the second edge together and thus functioning as the structural joint portion, and at least one of the latch-shape edges is made of an electrically conductive material so as to function as the electrical connection portion.

4. The microelectronic 3D packaging structure of claim 1, wherein the joint connection portion comprises an electrical connection portion for defining the connection path and a structural joint portion for jointing at least one edge of the first board and at least one edge of the second board.

5. The microelectronic 3D packaging structure of claim 1, wherein the joint connection portion is sidewall socket module which further comprises a structural joint portion for jointing at least one edge of the first board and at least one edge of the second board together, and
an electrical connection portion for providing electrical connection path between the first board and the second board.

6. The microelectronic 3D packaging structure of claim 5, wherein a rotational axle is centrally disposed within the sidewall socket module.

7. A microelectronic 3D packaging structure, comprising:
a folding board set having a plurality of board surfaces and a plurality of folding connection portions each connecting two adjacent board surfaces, wherein a folding line is disposed on each of the folding connection portions and adapted to enable the folding board set to form a folded structure; and
at least a joint connection portion disposed at a joint line of two adjacent board surfaces in the folded structure and adapted to function as a first connection path for transmitting signals between two adjacent board surfaces; and
a base substrate, wherein the folded structure is mounted on the base substrate at a predetermined location to form a plurality of base joint lines, and signals are transmitted between the base substrate and the folded structure through a second connection path across the base joint lines;
wherein the base substrate further comprises a cavity, and the folded structure further defines therein a void space aligned substantially with the cavity.

8. The microelectronic 3D packaging structure of claim 7, wherein the board surfaces each comprise a set of contacts coupled to at least an electronic device disposed on the board surfaces, and the contacts between two adjacent board surfaces are coupled to each other through the joint connection portion at the joint line between two adjacent board surfaces.

9. The microelectronic 3D packaging structure of claim 7, wherein the joint connection portion each comprises an electrical connection portion for defining the first connection path and a structural joint portion for jointing two adjacent board surfaces, wherein the electrical connection portion is selected from the group consisting of a bonding wire, a solder bump, a sol gel print wire, an electrically conductive latch device, an electrically conductive mechanical switch, an optical fiber, an electrically conductive anchor device, an electrically conductive socket device, and a combination thereof, and the structural joint portion is selected from the group consisting of a rail, a slot, a pin, an anchor, a latch, an adhesive, a socket, and a combination thereof.

10. The microelectronic 3D packaging structure of claim 7, wherein the joint connection portion comprises an insulating spacer mounted along the joint line, wherein the insulating spacer is made of a material selected from the group consisting of an adhesive, an epoxy, a plastic, a ceramic, a resin, and a combination thereof.

11. The microelectronic 3D packaging structure of claim 7, wherein the folding board set further comprises at least a lid board jointed to edges of at least two of the board surfaces through at least a lid joint portion each selected from the group consisting of a rail, a slot, a pin, an anchor, a latch, an adhesive, a socket, and a combination thereof.

12. The microelectronic 3D packaging structure of claim 11, wherein at least an electronic device is disposed on the lid board and coupled to the electronic device on at least one board through a lid connection portion which is selected from the group consisting of a bonding wire, a solder bump, a sol gel print wire, a soft board, an electrically conductive latch device, an electrically conductive socket device, an electrically conductive mechanical switch, an optical fiber, and a combination thereof.

13. The microelectronic 3D packaging structure of claim 7, wherein the void space has therein at least one cooling device.

14. The microelectronic 3D packaging structure of claim 7, further comprising a second folded structure, wherein the second folded structure is stacked on and coupled to the folded structure through another electrical connection portion selected from the group consisting of a bonding wire, a solder bump, a sot gel print wire, a soft board, an electrically conductive latch device, an electrically conductive socket device, an electrically conductive mechanical switch, an optical fiber, an electrically conductive anchor device, and a combination thereof.

\* \* \* \* \*